United States Patent
Shin et al.

(10) Patent No.: US 12,125,785 B2
(45) Date of Patent: Oct. 22, 2024

(54) SEMICONDUCTOR INTEGRATED CIRCUIT DEVICE SUPPRESSING LEAKAGE CURRENT OF MULTILAYER WIRING STRUCTURES

(71) Applicant: SAMSUNG ELECTRONICS CO., LTD., Suwon-si (KR)

(72) Inventors: Junghoo Shin, Seoul (KR); Jongmin Baek, Seoul (KR); Sanghoon Ahn, Seongnam-si (KR); Woojin Lee, Hwaseong-si (KR); Junhyuk Lim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 421 days.

(21) Appl. No.: 17/530,206

(22) Filed: Nov. 18, 2021

(65) Prior Publication Data

US 2022/0384340 A1   Dec. 1, 2022

(30) Foreign Application Priority Data

May 31, 2021 (KR) .................. 10-2021-0069970

(51) Int. Cl.
*H01L 23/528* (2006.01)
*H01L 21/768* (2006.01)
(Continued)

(52) U.S. Cl.
CPC .... *H01L 23/5283* (2013.01); *H01L 21/76885* (2013.01); *H01L 21/76897* (2013.01);
(Continued)

(58) Field of Classification Search
CPC ............. H01L 23/5283; H01L 23/5226; H01L 23/53295
See application file for complete search history.

(56) References Cited

U.S. PATENT DOCUMENTS

| 6,174,804 B1 | 1/2001 | Hsu |
| 6,211,085 B1 | 4/2001 | Liu |
(Continued)

FOREIGN PATENT DOCUMENTS

| KR | 20100001700 A | 1/2010 |
| KR | 20180061473 A | 6/2018 |
| KR | 20200037531 A | 4/2020 |

*Primary Examiner* — Jay C Chang
*Assistant Examiner* — Mikka Liu
(74) *Attorney, Agent, or Firm* — Sughrue Mion, PLLC

(57) ABSTRACT

A semiconductor integrated circuit device includes a substrate; a transistor on the substrate; an interlayer insulating film on the transistor; an insulating liner on the interlayer insulating film; a first insulating film on the insulating liner; and a first wiring layer on the interlayer insulating film and surrounded by the insulating liner. A height of a top surface of the first insulating film in a vertical direction from a main surface of the interlayer insulating film is different than a height of a top surface of the first wiring layer in the vertical direction. A step exists between the top surfaces of the first wiring layer and the first insulating film. A height of the first insulating film is greater than a height of the first wiring layer. A width of the first wiring layer gradually narrows as the first wiring layer extends upwards along the vertical direction.

20 Claims, 17 Drawing Sheets

(51) Int. Cl.
   *H01L 23/522*   (2006.01)
   *H01L 23/532*   (2006.01)
(52) U.S. Cl.
   CPC .... *H01L 23/5226* (2013.01); *H01L 23/53295* (2013.01); *H01L 21/76831* (2013.01); *H01L 21/76843* (2013.01); *H01L 23/53214* (2013.01); *H01L 23/53238* (2013.01); *H01L 23/53257* (2013.01)

(56) References Cited

U.S. PATENT DOCUMENTS

| | | |
|---|---|---|
| 10,199,325 B2 | 2/2019 | Yim et al. |
| 2009/0203201 A1 | 8/2009 | Masuda et al. |
| 2014/0138848 A1* | 5/2014 | Matsuura .......... H01L 21/76877 257/774 |
| 2020/0090987 A1 | 3/2020 | Chandhok et al. |
| 2020/0105664 A1 | 4/2020 | Han et al. |
| 2020/0303254 A1 | 9/2020 | Parikh |
| 2020/0343131 A1* | 10/2020 | Choi ................ H01L 23/53209 |
| 2021/0005548 A1 | 1/2021 | Lee et al. |

* cited by examiner

SEMICONDUCTOR INTEGRATED CIRCUIT DEVICE SUPPRESSING LEAKAGE CURRENT OF MULTILAYER WIRING STRUCTURES

CROSS-REFERENCE TO THE RELATED APPLICATION

A claim of priority under 35 U.S.C. § 119 is made to Korean Patent Application No. 10-2021-0069970, filed on May 31, 2021, in the Korean Intellectual Property Office, the entirety of which is hereby incorporated herein by reference.

BACKGROUND

The present disclosure relates to semiconductor integrated circuit devices and manufacturing methods thereof. In particular, the present disclosure relates to semiconductor integrated circuit devices including a multilayer wiring structure and manufacturing methods thereof.

Responsive to the rapid advance of electronic industries and user demand, electronic appliances are being further miniaturized and multi-functionalized. Accordingly, the down-scaling of semiconductor integrated circuit devices is rapidly progressing, and line width and pitch of multilayer wiring structures included in semiconductor integrated circuits are decreasing. To this end, there is increasing demand to provide integrated circuit devices having enhanced electrical characteristics and reliability, and whereby time-dependent dielectric breakdown (TDDB) of the integrated circuit devices is prevented by suppressing leakage current of the multilayer wiring structures therein.

SUMMARY

Embodiments of the inventive concepts provide a semiconductor integrated circuit device capable of minimizing capacitance loss between adjacent wiring layers, and a method for forming a via for self-alignment between wiring layers without using additional processes.

Embodiments of the inventive concepts provide a semiconductor integrated circuit device including a substrate; a transistor on the substrate; an interlayer insulating film on the transistor; an insulating liner on the interlayer insulating film; a first insulating film on the insulating liner; and a first wiring layer on the interlayer insulating film and surrounded by the insulating liner. A height of a top surface of the first insulating film in a first direction from a main surface of the interlayer insulating film is different than a height of a top surface of the first wiring layer in the first direction from the main surface of the interlayer insulating film. A step exists between the top surfaces of the first wiring layer and the first insulating film. A height of the first insulating film is greater than a height of the first wiring layer. A width of the first wiring layer gradually narrows as the first wiring layer extends along the first direction.

Embodiments of the inventive concepts further provide a semiconductor integrated circuit device including a substrate; a front-end-of-line (FEOL) structure on the substrate, the FEOL structure including a transistor; and a back-end-of-line (BEOL) structure on the FEOL structure. The BEOL structure includes a first insulating film including a carbon content that varies in accordance with a height of the first insulating film in a first direction from a main surface of the FEOL structure; and a first wiring layer extending through the first insulating film. A height of a top surface of the first insulating film in the first direction from the main surface of the FEOL structure is different than a height of a top surface of the first wiring layer in the first direction from the main surface of the FEOL structure. A step exists between the top surfaces of the first wiring layer and the first insulating film. A width of the first wiring layer gradually narrows as the first wiring layer extends along the first direction.

Embodiments of the inventive concepts still further provide a semiconductor integrated circuit device including a substrate that includes a semiconductor material; a front-end-of-line (FEOL) structure on the substrate, the FEOL structure including a transistor; and a back-end-of-line (BEOL) structure on the FEOL structure. The BEOL structure includes a first insulating film including a carbon content that varies in accordance with a height of the first insulating film in a first direction from a main surface of the FEOL structure; a first wiring layer extending through the first insulating film, wherein a height of a top surface of the first insulating film in the first direction from the main surface of the FEOL structure is different than a height of a top surface of the first wiring layer in the first direction from the main surface of the FEOL structure, and a step exists between the top surfaces of the first wiring layer and the first insulating film; an insulating liner surrounding a bottom portion and a side portion of the first insulating film, the insulating liner between the first insulating film and the first wiring layer; a second insulating film on the first insulating film and the first wiring layer, and that exposes the first wiring layer; and a second wiring layer on the second insulating film and connected to the first wiring layer. The second wiring layer includes a metal film that includes a material different from a material of the first wiring layer, and a conductive barrier film surrounding the metal film. A width of the first wiring layer gradually narrows as the first wiring layer extends along the first direction. A carbon content of the first insulating film continuously increases in accordance with a height thereof along the first direction. A carbon content of the second insulating film is uniform along a height thereof in the first direction.

BRIEF DESCRIPTION OF THE DRAWINGS

The forgoing and other features of the inventive concepts will be described hereinafter with reference to the accompanying drawings.

DETAILED DESCRIPTION

Figure 1:
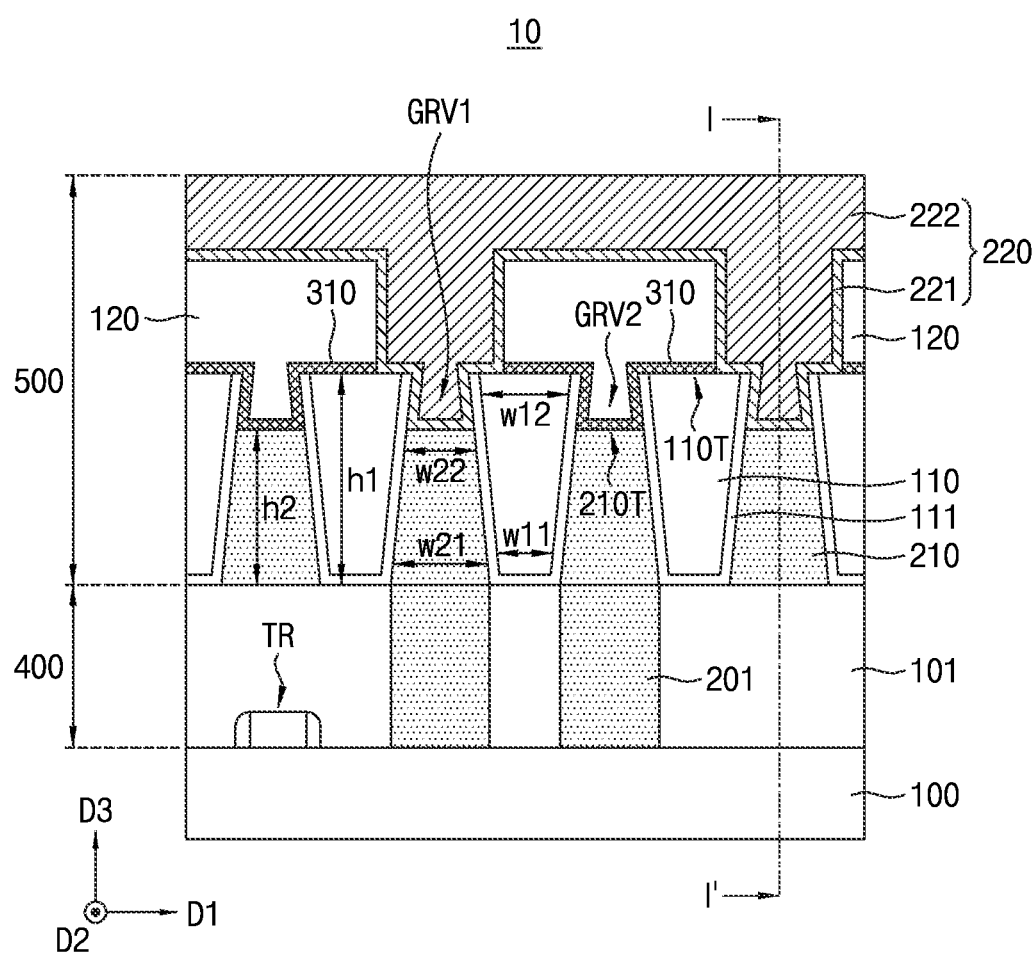
FIG. 1 illustrates a cross-sectional view of a semiconductor integrated circuit device according to embodiments of the inventive concepts.

Hereinafter, embodiments of the inventive concepts will be described in detail with reference to the accompanying drawings. Herein, like reference numerals will denote like elements, and redundant descriptions thereof may be omitted for conciseness. The drawings may not necessarily be to scale. Also, throughout the description, relative locations of components may be described using terms such as for example "vertical", "horizontal", "over", "higher" and so on. These terms are for descriptive purposes only, and are intended only to describe the relative locations of components assuming the orientation of the overall device is the same as shown in the drawings. The embodiments however are not limited to the illustrated device orientations.

Figure 2:
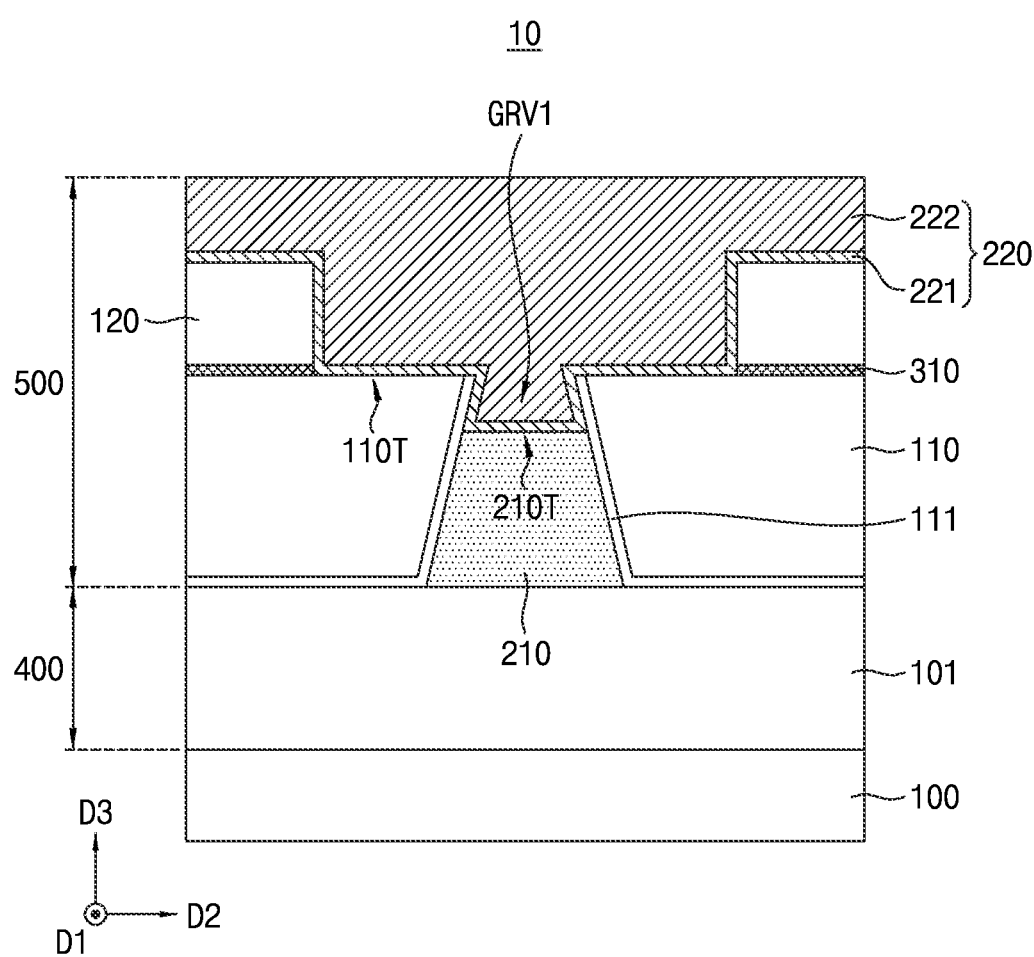
FIG. 2 illustrates another cross-sectional view of the semiconductor integrated circuit device shown in FIG. 1 as taken in a different direction.

FIG. 1 illustrates a cross-sectional view of a semiconductor integrated circuit device according to embodiments of the inventive concepts. FIG. 2 illustrates a cross-sectional view of the semiconductor integrated circuit device shown in FIG. 1 as taken in different direction. FIG. 2 illustrates a cross-sectional view as taken in the direction along line I-I' in FIG. 1.

Direction indication lines are indicated in FIGS. 1 and 2 for ease of description of relative positional relations among constituent elements included in the semiconductor integrated circuit device 10. In the specification, a first direction D1 and a second direction D2 may refer to respective directions intersecting on a horizontal plane, and a third direction D3 may refer to a vertical direction. For example, the first direction D1 may correspond to an X-axis direction, the second direction D2 may correspond to a Y-axis direction, and the third direction D3 may correspond to a Z-axis direction. The plane formed in the first direction D1 and the second direction D2 may be a horizontal plane. In some embodiments, the third direction D3 may be characterized as a direction that extends perpendicular to the horizontal plane that extends in the first direction D1 and the second direction D2. Here, the terms "vertical" and "horizontal" are merely relative spatial descriptors arbitrarily assigned for purposes of this description.

Referring to FIGS. 1 and 2, the semiconductor integrated circuit device 10 may include a substrate 100, a front-end-of-line (FEOL) structure 400 disposed on the substrate 100, and a back-end-of-line (BEOL) structure 500 disposed on the FEOL structure 400. The BEOL structure 500 may include a plurality of wiring layers. Hereinafter, when an element or layer is described as being positioned "on" another element or layer, this should be construed as including not only the case in which one element or layer is disposed just over (i.e., directly on) the other element or layer, but also the case in which an intermediate element or layer is disposed therebetween.

The substrate 100 may be a wafer including silicon (Si). Alternatively, the substrate 100 may be a wafer including a semiconductor element such as for example germanium (Ge) or a compound semiconductor such as silicon carbide (SiC), gallium arsenide (GaAs), indium arsenide (InAs) or indium phosphide (InP). The substrate 100 may have a silicon-on-insulator (SOI) structure. In addition, the substrate 100 may include a device region (not shown) including a region in which a transistor TR is formed, an active region, and a field region, among other regions.

The FEOL structure 400 may be formed by an FEOL process. The FEOL process may refer to a process of forming individual elements, such as for example transistors, capacitors, resistors, and/or the like, on the substrate 100 in a manufacturing procedure of an integrated circuit chip. For example, the FEOL process may include for example planarization and cleaning of a wafer, formation of a trench, formation of a well, formation of a gate line, and formation of a source and a drain, among other processes.

For example, the FEOL structure 400 may constitute a logic cell including a multi-bridge channel FET (MBCFET), or a logic cell including any of a metal-oxide-semiconductor field effect transistor (MOSFET), a fin field effect transistor (FinFET), a system large scale integration (LSI) device, a microelectromechanical system (MEMS), an active device, or a passive device which include a plurality of transistors.

In an embodiment, an interlayer insulating film 101, and a contact plug 201 extending therethrough may be disposed in the FEOL structure 400. For example, the interlayer insulating film 101 may be made of a silicon compound such as silicon oxide, silicon nitride, silicon oxynitride, or the like. The contact plug 201 may have a conductive structure including a metal. The metal may for example be constituted by copper (Cu), tungsten (W), aluminum (Al), cobalt (Co), ruthenium (Ru), molybdenum (Mo), an alloy thereof, or the like. In some embodiments, the contact plug 201 may be electrically connected to an active region formed at the substrate 100. Although not clearly shown, the contact plug 201 may for example be connected to a source/drain or a gate electrode of the transistor TR formed at the substrate 100.

The BEOL structure 500 may be formed by a BEOL process. The BEOL process may refer to a process for mutually interconnecting individual elements, such as for example transistors, capacitors, resistors, and/or the like. in a manufacturing procedure of an integrated circuit chip. For example, the BEOL process may include silicidation of a region where a gate is formed and source/drain regions, addition of dielectrics, planarization, formation of a hole, addition of a metal layer, formation of a contact plug, and formation of a passivation layer, among other processes. For example, the semiconductor integrated circuit device 10 may be packaged in a semiconductor package after execution of the BEOL process and, as such, may be used as an element for various applications.

The BEOL structure 500 may include a plurality of wiring layer structures 210-220 electrically connected to the FEOL structure 400, and insulating films 110 and 120 for insulating parts of the plurality of wiring layer structures 210-220. The wiring layer structures 210 and 220 may hereinafter be referred to respectively as a first wiring layer 210 and a second wiring layer 220. For example, the wiring layer structure 210 may be characterized as including a plurality of wiring parts respectively sandwiched between and insulated from each other by respective insulating parts of first insulating film 110. Somewhat similarly, the wiring layer structure 220 may be characterized as including a plurality of wiring parts respectively sandwiched between and insulated from each other by respective insulating parts of second insulating film 120.

An insulating liner 111 and a first insulating film 110 may be disposed on the interlayer insulating film 101.

The insulating liner 111 may be disposed to surround a bottom portion and a side portion of the first insulating film 110. In an embodiment, the insulating liner 111 may be formed up to a level to which the first insulating film 110 extends along a vertical direction (third direction D3), such that the insulating liner 111 completely surrounds the side portion of the first insulating film 110. For example, the insulating liner 111 may be made of a silicon compound such as silicon oxide, silicon nitride, silicon oxynitride, or the like.

The first insulating film 110 may be disposed on the insulating liner 111. In an embodiment, the first insulating film 110 may be made of a silicon oxide compound. The first insulating film 110 may be constituted by a low-k dielectric film having a low dielectric constant of about 2.2 to 3.0, for example, an SiOC film or a SiCOH film.

In an embodiment, the first insulating film 110 may have a carbon (C) content varying in accordance with a height thereof. Accordingly, the first insulating film 110 may have a low dielectric constant varying in accordance with a height thereof (the height may mean a distance from the main or uppermost surface of interlayer insulating film 101 along the third direction D3). In an embodiment, the carbon (C) content of the first insulating film 110 may be gradually increased as the first insulating film 110 extends upwards. In some embodiments, the first insulating film 110 may not include carbon at a lowermost portion thereof. For example, the carbon (C) content of the first insulating film 110 may be 0 to 5% at the lowermost portion (for example, a portion adjacent to a bottom surface) of the first insulating film 110, and may be 10 to 15% at an uppermost portion (for example, a portion adjacent to a top surface) of the first insulating film 110. For example, the carbon (C) content of the first insulating film 110 may be continuously increased as the first insulating film 110 extends upwards.

When the first insulating film 110 is configured to have a carbon (C) content varying in accordance with a height thereof, the first insulating film 110 may have a low dielectric constant varying in accordance with a height thereof. For example, when the low dielectric constant of the first insulating film 110 is set to be small in a region of the first insulating film 110 adjacent to an interface between the first wiring layer 210 and the second wiring layer 220 (for example, an upper portion of the first insulating film 110), it may be possible to minimize loss caused by coupling between the first wiring layer 210 and the second wiring layer 220. In addition, when the low dielectric constant of the first insulating film 110 is set to be great in a region of the first insulating film 110 between adjacent first wiring layers 210 (for example, a lower portion of the first insulating film 110), it may be possible to minimize signal loss caused by cross-talk noise and resistor-capacitor (RC) delay between the adjacent first wiring layers 210.

The uppermost portion of the first insulating film 110 may have a height h1 from a top surface of the interlayer insulating film 101. In an embodiment, the first insulating film 110 may have different widths (for example, w11 and w12) in accordance with different heights thereof. In an embodiment, the width of the first insulating film 110 may be gradually increased as the first insulating film 110 extends upwards. As shown in FIG. 1, in an embodiment a first width w11 at a relatively lower portion of the first insulating film 110 may be less than a second width w12 of a relatively upper portion of the first insulating film 110. For example, the width of the first insulating film 110 may be smallest at the bottom surface of the first insulating film 110 while being greatest at the top surface of the first insulating film 110.

The first wiring layer 210 may be further disposed on the interlayer insulating film 101.

The first wiring layer 210 may be constituted by a plurality of metal patterns. The first wiring layer 210 may extend through the first insulating film 110. The first wiring layer 210 may be disposed between portions of the first insulating film 110 adjacent to each other. In an embodiment, a part of the plurality of metal patterns constituting the first wiring layer 210 may be connected to the contact plug 201.

The first wiring layer 210 may be surrounded by the insulating liner 111. A side surface of the first wiring layer 210 may contact the insulating liner 111. In some embodiments, the first wiring layer 210 may not contact the first insulating film 110. In this case, the insulating liner 111 may be disposed between the first wiring layer 210 and the first insulating film 110.

In an embodiment, the first wiring layer 210 may be a conductive structure including a metal. The metal may for example be constituted by aluminum (Al), ruthenium (Ru), molybdenum (Mo), tungsten (W), cobalt (Co), an alloy thereof, or the like.

An uppermost portion of the first wiring layer 210 may have a second height h2 from the top surface of the interlayer insulating film 101. In an embodiment, the second height h2 may be lower than (i.e., less than) the first height h1. That is, the height of the first wiring layer 210 may be lower than (i.e., less than) the height of the first insulating film 110. For example, the height of a top surface 210T of the first wiring layer 210 may be lower than (i.e., less than) the height of a top surface 110T of the first insulating film 110. A step may be formed due to a height difference between the top surface 210T of the first wiring layer 210 and the top surface 110T of the first insulating film 110. For example, the step may be about 2 to 8 nm. That is, the difference between the first height h1 and the second height h2 may be about 2 to 8 nm. In some embodiments, the first height h1 and the second height h2 may be defined on the basis of a specific reference surface having a constant height.

The first insulating film 110, and the first wiring layer 210 extending through and surrounded by the first insulating film 110, may form grooves GRV1 and GRV2 due to the step thereof. The BEOL structure 500 may include a plurality of grooves (for example, a first groove GRV1 and a second groove GRV2). The grooves GRV1 and GRV2 may be formed on the first wiring layer 210. In an embodiment, each of the grooves GRV1 and GRV2 may have a bottom portion constituted by the top surface 210T of the first wiring layer 210, and a side portion constituted by the first insulating film 110 (or the insulating liner 111). For example, the first groove GRV1 may be defined as a groove including a metal material as a groove-filling material, and the second groove GRV2 may be defined as a groove including an insulating material as a groove-filling material.

In an embodiment, a bottom surface of the first wiring layer 210 may be disposed at a lower level than the bottom surface of the first insulating film 110. The bottom surface of the first wiring layer 210 may be disposed to directly contact the interlayer insulating film 101, but the bottom surface of the first insulating film 110 may be disposed on the insulating liner 111 disposed on the interlayer insulating film 101.

In an embodiment, the first wiring layer 210 may have different widths (for example, w21 and w22) in accordance with different heights thereof. In an embodiment, the width of the first wiring layer 210 may be gradually reduced as the first wiring layer 210 extends upwards. In other words, the width of the first wiring layer 210 is gradually narrowed from the bottom to the top along the vertical direction (the third direction D3). A third width w21 at a relatively lower portion of the first wiring layer 210 may be larger than a fourth width w22 at a relatively upper portion of the first wiring layer 210. For example, the width of the first wiring layer 210 may be smallest at the top surface of the first wiring layer 210 while being greatest at the bottom surface of the first wiring layer 210. In an embodiment, the width of the top surface 210T of the first wiring layer 210 may be about 7 to 9 nm (for example, not less than 7 nm, but less than 9 nm), and the width of the bottom surface of the first wiring layer 210 may be 9 nm to 11 nm (for example, not less than 9 nm, but less than 11 nm).

A mask film 310 may be disposed on portions of the first insulating film 110 and the first wiring layer 210.

In an embodiment, the mask film 310 may function as an etch stopper. The mask film 310 may have etch selectivity different from that of the first insulating film 110. For example, the mask film 310 may include a material having no or low etch selectivity. For example, the mask film 310 may include at least one selected from aluminum oxide ($Al_xO_y$), zirconium oxide ($Zr_xO_y$), hafnium oxide ($Hf_xO_y$), silicon nitride, or aluminum oxide.

The mask film 310 may contact portions of the top surface 110T of the first insulating film 110 and top surfaces of the insulating liner 111 and the first wiring layer 210. A portion of the mask film 310 may be formed at the second groove GRV2. In an embodiment, the mask film 310 may be formed between the first insulating film 110 and the second insulating film 120, between the first wiring layer 210 and the second insulating film 120 and/or between the insulating liner 111 and the second insulating film 120.

The second insulating film 120 may be disposed on the mask film 310. The second insulating film 120 may fill the second groove GRV2. In an embodiment, the second insulating film 120 may be made of a silicon oxide compound. In some embodiments, the second insulating film 120 may be made of a material having a low dielectric constant (for example, SiOC or SiCOH). In this case, the second insulating film 120 may have a substantially constant low dielectric constant in accordance with heights thereof. That is, the second insulating film 120 may have a uniform (substantially the same) carbon (C) content at any height thereof.

In an embodiment, the second insulating film 120 may fill the second groove GRV2, and may expose the first groove GRV1. In an embodiment, the second insulating film 120 may be disposed only at a position overlapping with a region in which the mask film 310 is formed. The first insulating film 110 and the first wiring layer 210 may include, at portions thereof, a region not overlapping with the second insulating film 120 in a vertical direction (the third direction D3). The second insulating film 120 may expose at least a portion of the top surface 210T of the first wiring layer 210.

The second wiring layer 220 may be formed on the second insulating film 120 such that the second wiring layer 220 fills the first groove GRV1 exposed by the second insulating film 120. The second wiring layer 220 may be self-aligned on the first wiring layer 210 while filling the first groove GRV1 exposed by the second insulating film 120.

The second wiring layer 220 may include a metal film 222, and a conductive barrier film 221 surrounding the metal film 222.

The conductive barrier film 221 may cover a top portion and the side portion of the second insulating film 120, and the side portion and the bottom portion of the first groove GRV1. The conductive barrier film 221 may further cover a portion of a top surface of the first insulating film 110. In an embodiment, the conductive barrier film 221 may contact the first insulating film 110, the mask film 310, the insulating liner 111, and the first wiring layer 210.

For example, the conductive barrier film 221 may be made of tantalum (Ta), tantalum nitride (TaN), titanium (Ti), titanium nitride (TiN), or an alloy thereof.

The metal film 222 may be disposed on (or inside) the conductive barrier film 221. For example, the metal film 222 may be made of copper (Cu), tungsten (W), aluminum (Al), cobalt (Co), ruthenium (Ru), or an alloy thereof.

In an embodiment, the metal film 222 may include a material different from that of the first wiring layer 210. For example, the metal film 222 may include copper (Cu), and the first wiring layer 210 may include aluminum (Al), ruthenium (Ru), molybdenum (Mo), tungsten (W), or cobalt (Co).

The second wiring layer 220 may contact the first wiring layer 210 through the first groove GRV1.

Hereinafter, a manufacturing method of the semiconductor integrated circuit device 10 will be described.

FIGS. 3 to 14 illustrate sequential cross-sectional views explanatory of a manufacturing method of a semiconductor integrated circuit device according to embodiments of the inventive concepts.

A manufacturing method of a semiconductor integrated circuit device 10 may include a procedure for manufacturing a first wiring layer 210 and a second wiring layer 220. The following description will be given mainly in conjunction with the procedure for manufacturing the first wiring layer 210 and the second wiring layer 220. Known manufacturing methods may be applied to operations preceding and following the procedure for manufacturing the first wiring layer 210 and the second wiring layer 220, and detailed description thereof may be omitted for the purpose of conciseness.

Figure 3:
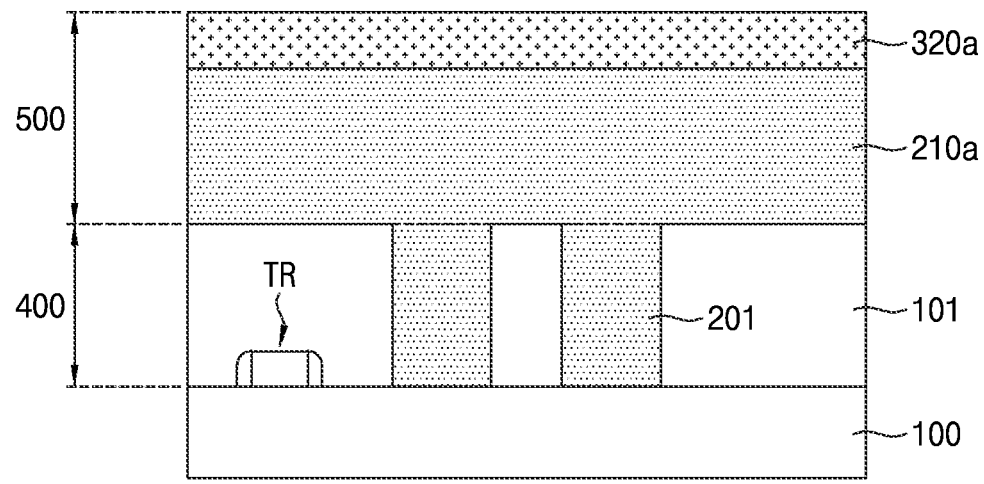
FIGS. 3, 4, 5, 6, 7, 8, 9, 10, 11, 12, 13 and 14 illustrate sequential cross-sectional views explanatory of a manufacturing method of a semiconductor integrated circuit device according to embodiments of the inventive concepts.

First, referring to operation S110 of FIG. 3, a first wiring material 210a may be formed (for example, deposited) on the FEOL structure 400. The first wiring material 210a may include the same material as the first wiring layer 210. Thereafter, a hard mask material 320a may be formed on the first wiring material 210a. Etch selectivity of the first wiring material 210a and etch selectivity of the hard mask material 320a may be different. In an embodiment, as described hereinafter, the first wiring layer 210 may be formed by patterning the first wiring material 210a.

Figure 4:
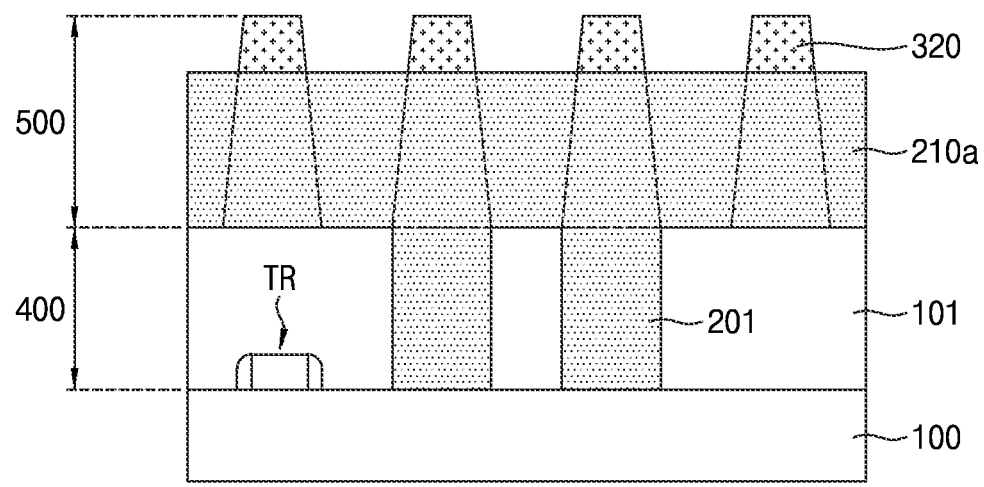

Subsequently, referring to operation S120 of FIG. 4, a portion of the hard mask material 320a not overlapping with position(s) where the first wiring layer 210 (as indicated by dashed lines) will be formed may be removed. For example, the portion of the hard mask material 320a may be removed through an etching process. The partially-removed hard mask material 320a may form a plurality of hard mask patterns 320.

Figure 5:
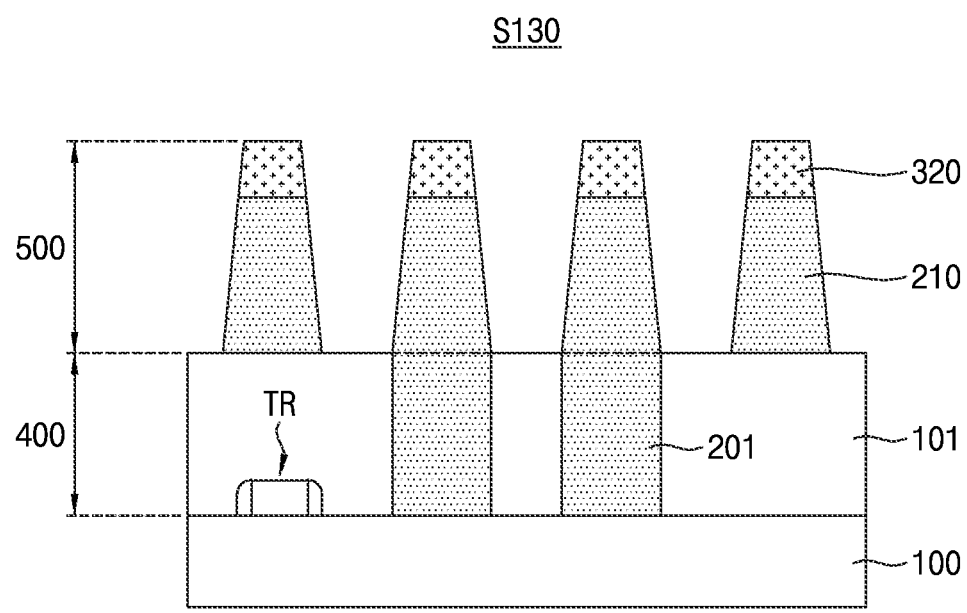

Thereafter, referring to operation S130 of FIG. 5, portions of the first wiring material 210a not overlapping with the plurality of hard mask patterns 320 may be removed. For example, the portions of the first wiring material 210a may be removed through an etching process. The partially-removed first wiring material 210a may become the first wiring layer 210 which includes a plurality of metal patterns. In this case, each metal pattern of the first wiring layer 210 may have a shape in which the width of the metal pattern is gradually reduced as the metal pattern extends upwards. For example, each metal pattern of the first wiring layer 210 may have a trapezoidal shape when viewed in cross-section.

Figure 6:
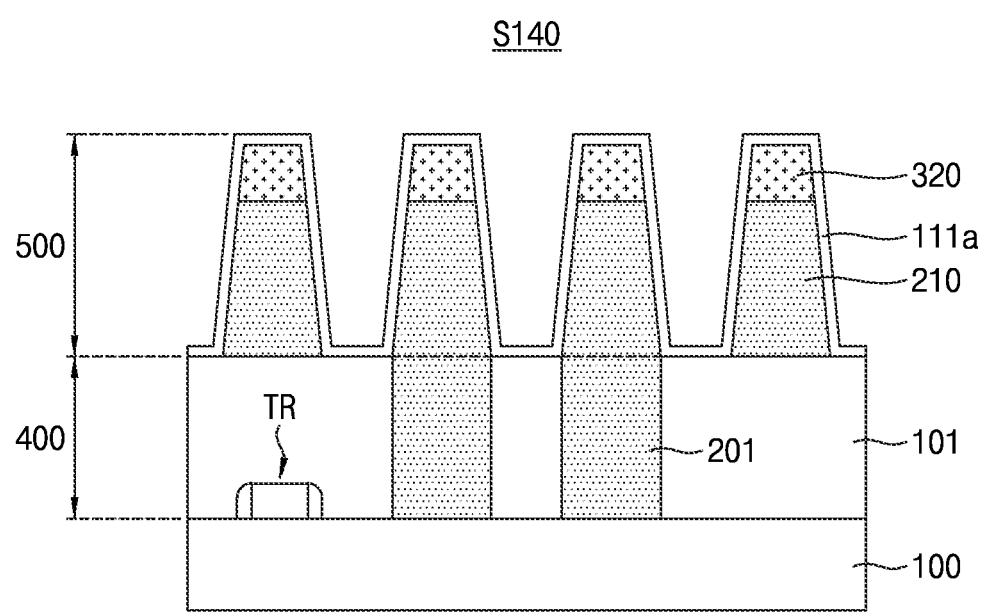

Thereafter, referring to operation S140 of FIG. 6, an insulating liner material 111a may be formed to cover the first wiring layer 210 and the plurality of hard mask patterns 320. The insulating liner material 111a may include the same material as the insulating liner 111.

Figure 7:
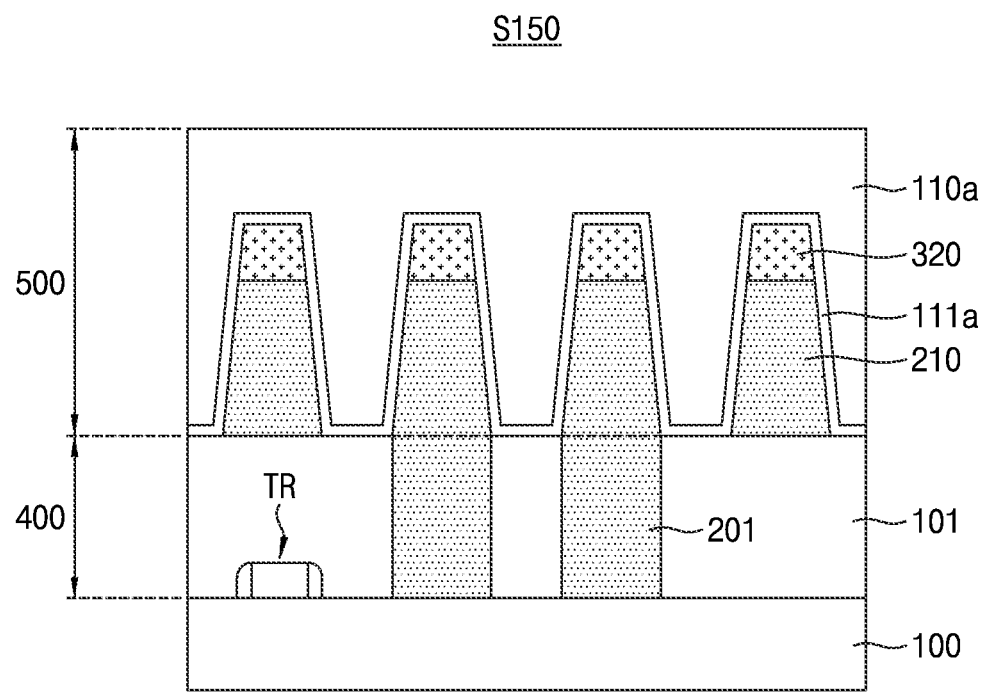

Subsequently, referring to operation S150 of FIG. 7, a first insulating material 110a may be formed on the insulating liner material 111a. The first insulating material 110a may include the same material as the first insulating film 110. In some embodiments, the first insulating material 110a may be configured such that the carbon content thereof is continuously increased as the first insulating material 110a extends upwards.

Figure 8:
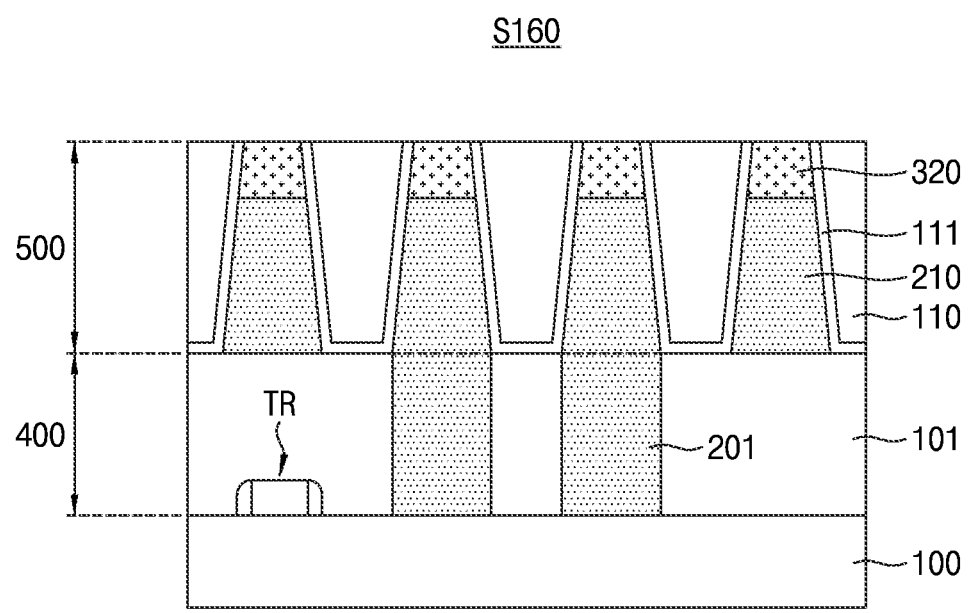

Thereafter, referring to operation S160 of FIG. 8, an upper portion of the first insulating material 110a may be removed. In an embodiment, the upper portion of the first insulating material 110a may be removed through application of a chemical mechanical polishing (CMP) process. For example, the first insulating material 110a may be removed until the plurality of hard mask patterns 320 is exposed. The first insulating material 110a, from which the upper portion thereof has been removed, may become a first insulating film 110. Also, the insulating liner material 111a, from which the upper portion thereof has been removed, may become an insulating liner 111.

Figure 9:
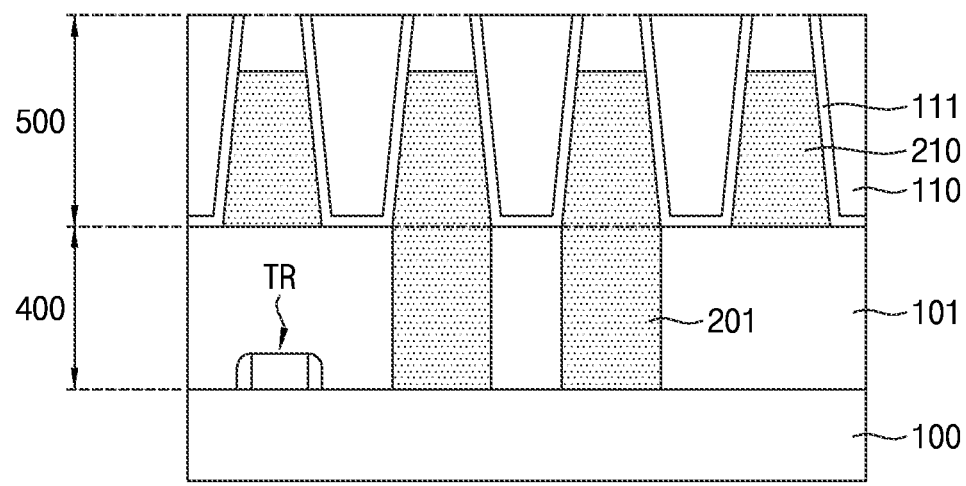

Subsequently, referring to operation S170 of FIG. 9, the plurality of hard mask patterns 320 may be removed. For example, the plurality of hard mask patterns 320 may be removed through a dry etching process or a wet etching process. As the plurality of hard mask patterns 320 is removed, a top surface 210T of the first wiring layer 210 may be exposed.

Figure 10:
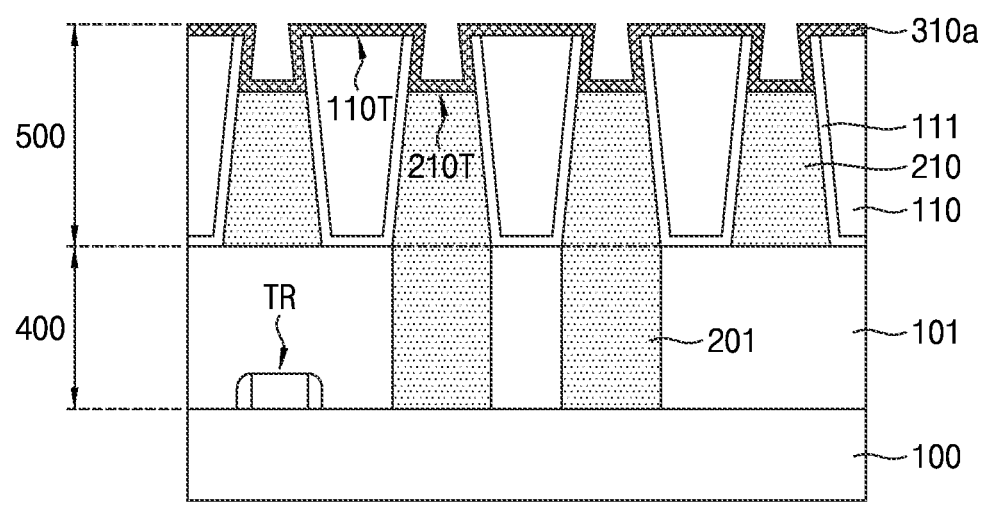

Next, referring to operation S180 of FIG. 10, an etch stop material 310a may be formed over the entirety of the top surface 210T of the first wiring layer 210 and a top surface 110T of the first insulating film 110. The etch stop material 310a may include the same material as a mask film 310. The etch stop material 310a may cover the top surface 210T of the first wiring layer 210, the top surface 110T of the first insulating film 110, and side surfaces of holes (for example, exposed side surfaces of the insulating liner 111).

Figure 11:
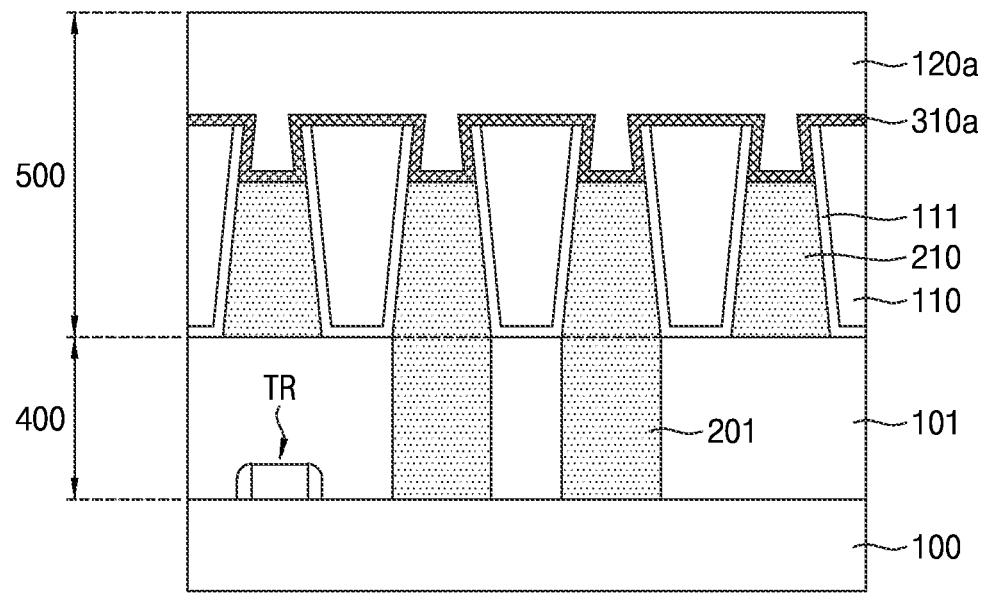

Thereafter, referring to operation S190 of FIG. 11, a second insulating material 120a may be formed on the etch stop material 310a. The second insulating material 120a may include the same material as a second insulating film 120. The second insulating material 120a may have properties of a gap-fill film.

Figure 12:
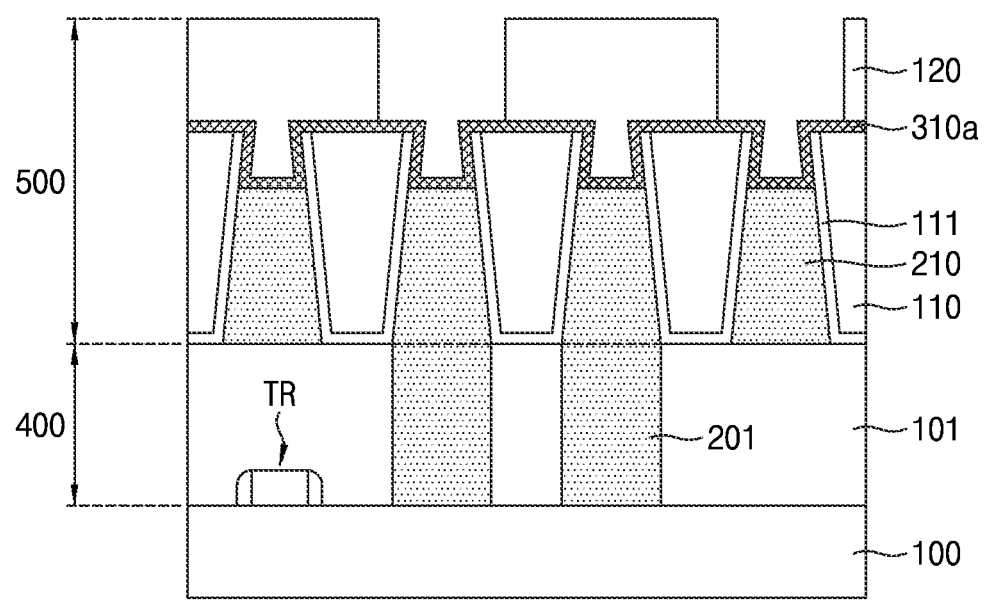

Subsequently, referring to operation S200 of FIG. 12, a portion of the second insulating material 120a overlapping with the first wiring layer 210 may be removed. For example, the portion of the second insulating material 120a may be removed through an etching process using a mask (not shown). The partially-removed second insulating material 120a may become the second insulating film 120. As the portion of the second insulating material 120a is removed, the etch stop material 310a may be exposed at a portion thereof corresponding to the removed portion.

Figure 13:
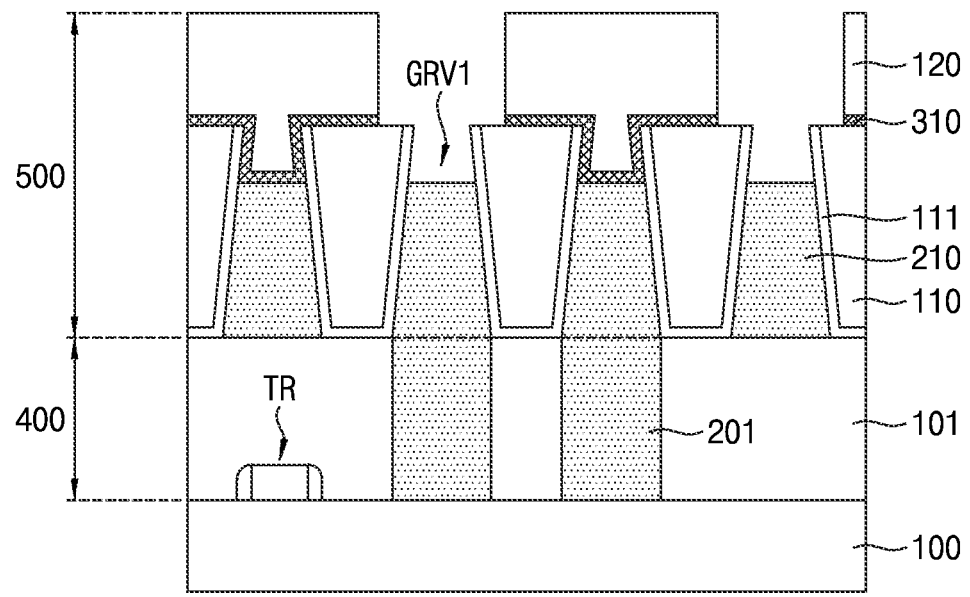

Subsequently, referring to operation S210 of FIG. 13, the portion of the etch stop material 310a exposed as the portion of the second insulating material 120a is removed, may be removed. For example, the portion of the etch stop material 310a may be removed through an etching process (for example, an over-etching process). As the portion of the etch stop material 310a is removed, a portion of the top surface 110T of the first insulating film 110, a portion of the insulating liner 111, and the top surface 210T of the first wiring layer 210 may be exposed. When the portion of the etch stop material 310a is removed, a first groove GRV1 may be formed. The partially-removed etch stop material 310a may become the mask film 310.

Figure 14:
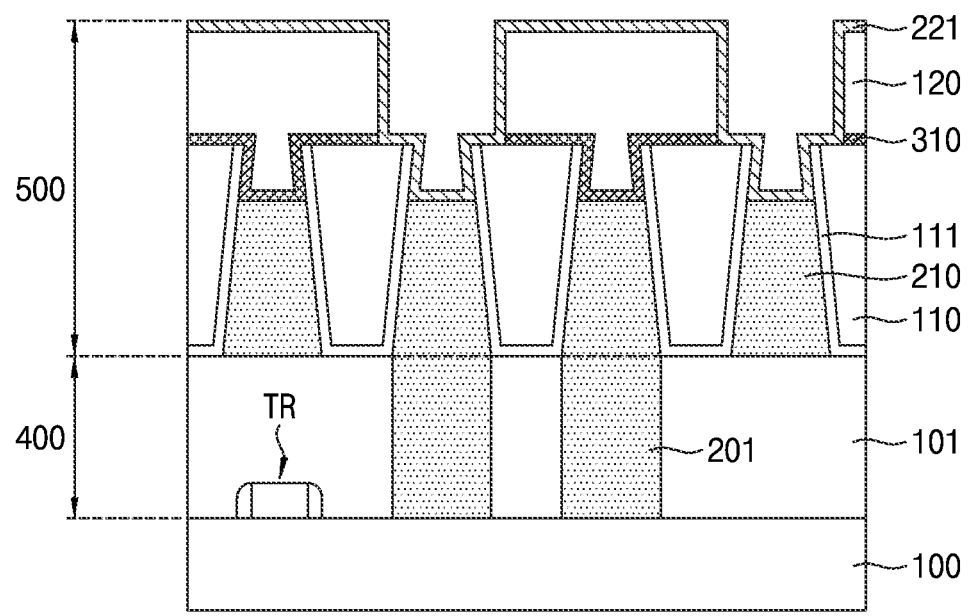

Next, referring to operation S220 of FIG. 14, a second wiring layer 220 (see FIG. 1) may be formed on the second insulating film 120 and a portion of the top surface 210T of the first wiring layer 210 exposed as the portion of the second insulating film 120 is removed. In an embodiment, the second wiring layer 220 may be formed by a process different from that of the first wiring layer 210. For example, the second wiring layer 220 may be formed through a damascene process. For example, the second wiring layer 220 may be formed by performing a stripping process for forming a conductive barrier film 221, and then performing a plating process for forming a metal film 222 (see FIG. 1).

Hereinafter, a semiconductor integrated circuit device according to another embodiment of the inventive concepts will be described. In the following, description of the same constituent elements as those of FIGS. 1 and 2 may be omitted for purposes of conciseness, and the same or similar reference numerals will be used for these constituent elements.

Figure 15:
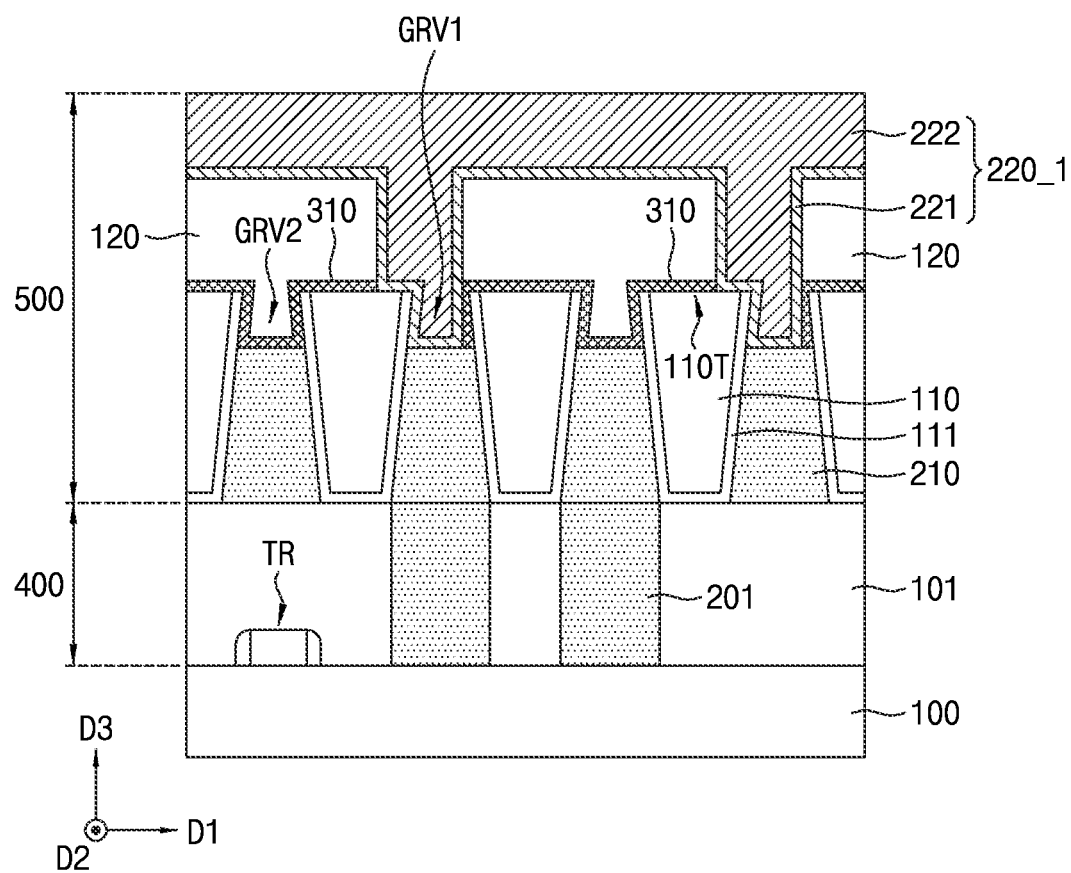
FIG. 15 illustrates a cross-sectional view of a semiconductor integrated circuit device according to embodiments of the inventive concepts.

FIG. 15 illustrates a cross-sectional view of a semiconductor integrated circuit device according to embodiments of the disclosure inventive concepts.

Referring to FIG. 15, a semiconductor integrated circuit device 10-1 according to this embodiment differs from the semiconductor integrated circuit device 10 according to the embodiment of FIG. 1 in that a position, at which a second wiring layer 220_1 extends through a second insulating film 120, is offset.

In the embodiment of FIG. 15, a top surface 210T of a first wiring layer 210 may contact the second wiring layer 220_1 and a mask film 310. In accordance with this embodiment, the contact area of the second wiring layer 220_1 on the top surface 210T of the first wiring layer 210 may be greater than the contact area of the mask film 310 on the top surface 210T of the first wiring layer 210. In accordance with this embodiment, the mask film 310 may be formed at a side surface of an upper hole of the first wiring layer 210. In this case, the mask film 310 may be disposed between the second wiring layer 220_1 and an insulating liner 111.

Although the alignment position of the second wiring layer 220_1 is offset as in this embodiment, the second wiring layer 220_1 may be self-aligned to contact the first wiring layer 210.

Figure 16:
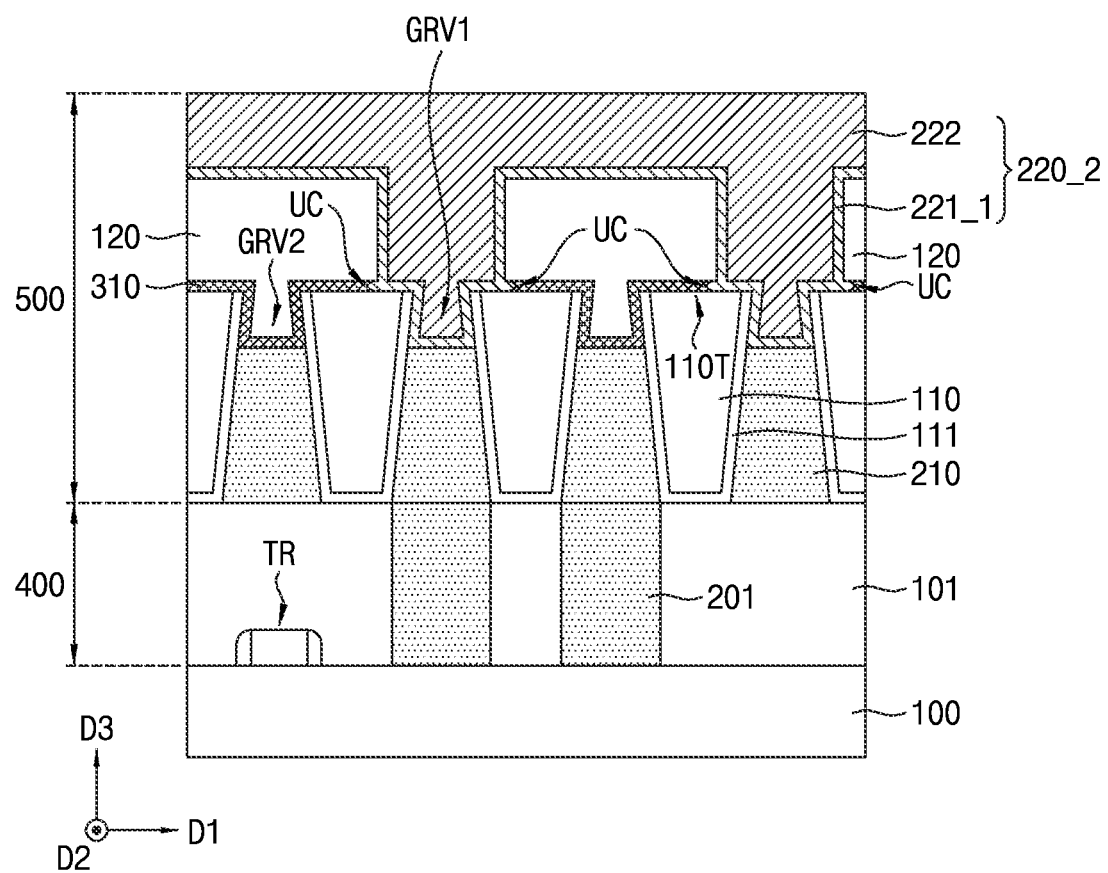
FIG. 16 illustrates a cross-sectional view of a semiconductor integrated circuit device according to embodiments of the inventive concepts.
Figure 17:
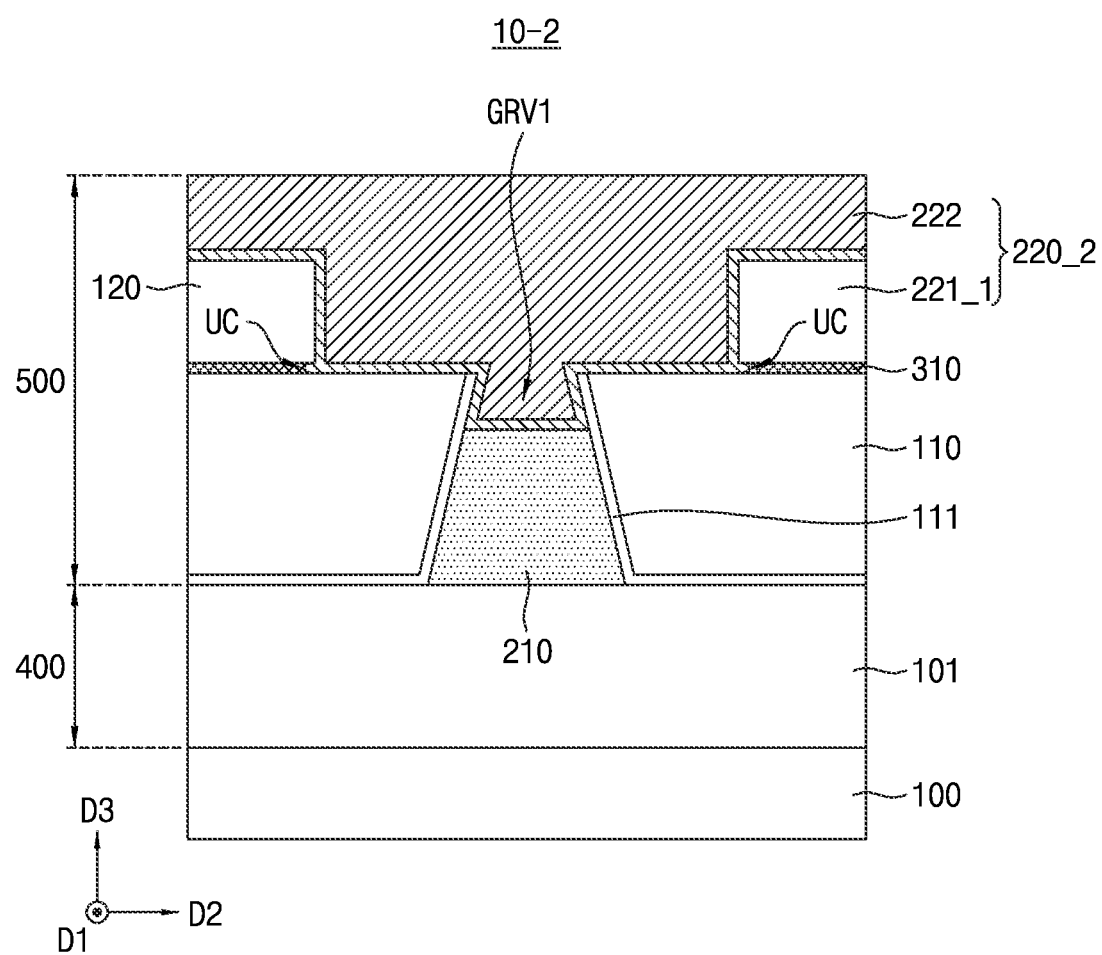
FIG. 17 illustrates a cross-sectional view of the semiconductor integrated circuit device shown in FIG. 16 as taken in a different direction.

FIG. 16 illustrates a cross-sectional view of a semiconductor integrated circuit device according to embodiments of the inventive concepts. FIG. 17 illustrates a cross-sectional view of the semiconductor integrated circuit device shown in FIG. 16 as taken in another direction.

Referring to FIGS. 16 and 17, a semiconductor integrated circuit device 10-2 according to this embodiment differs from the semiconductor integrated circuit device 10 according to the embodiment of FIGS. 1 and 2 in that an undercut UC is formed at a boundary between a mask film 310 and a conductive barrier film 221_1.

A second wiring layer 220_2 may include a metal film 222, and the conductive barrier film 221_1 which fills the undercut UC. The undercut UC may be formed at the mask film 310. In an embodiment, the conductive barrier film 221_1 may have a shape protruding (penetrating) into the mask film 310 at the boundary between the mask film 310 and the conductive barrier film 221_1. For example, the conductive barrier film 221_1 may extend into the undercut UC between the first insulating film 110 and the second insulating film 120. For example, additionally referring to operation S210 of FIG. 13, the mask film 310 may be formed by an over-etching process such that an end of the mask film 310 has an inwardly-concave shape. That is, as a portion of the etch stop material 310a is removed, the mask film 310 may be formed with an undercut UC having an inwardly-concave shape at an end thereof. When the conductive barrier film 221_1 is subsequently formed, the conductive barrier film 221_1 may have a convex shape at the boundary between the mask film 310 and the conductive barrier film 221_1 in order to correspond to the end of the mask film 310. The undercut UC may be formed on a top surface 110T of a first insulating film 110.

Figure 18:
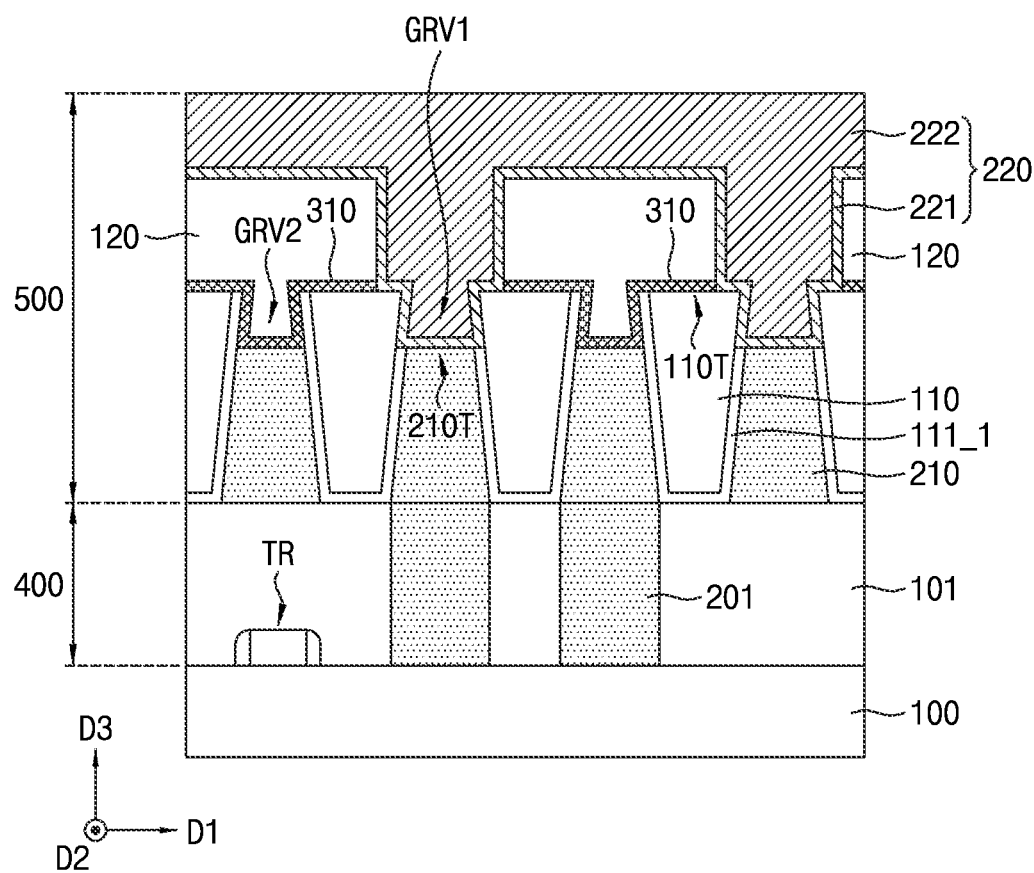
FIG. 18 illustrates a cross-sectional view of a semiconductor integrated circuit device according to embodiments of the inventive concepts.
}

FIG. 18 illustrates a cross-sectional view of a semiconductor integrated circuit device according to embodiments of the inventive concepts.

Referring to FIG. 18, a semiconductor integrated circuit device 10-3 according to this embodiment differs from the semiconductor integrated circuit device 10 according to the embodiment of FIG. 1 in that a second wiring layer 220 includes a portion contacting a side surface of a first insulating film 110.

In an embodiment, a portion of an insulating liner 111_1 contacting the side surface of the first insulating layer 110 may be removed in a manufacturing procedure for the semiconductor integrated circuit device 10. For example, additionally referring to operations S160 and S170 of FIGS. 8 and 9, the insulating liner 111_1 contacting the hard mask pattern 320 in FIG. 18 may be removed simultaneously with removal of the hard mask pattern 320. Accordingly, the second wiring layer 220 may contact a portion of a side surface of a second insulating layer 120 disposed at a higher level than a top surface 210T of a first wiring layer 210.

Figure 19:
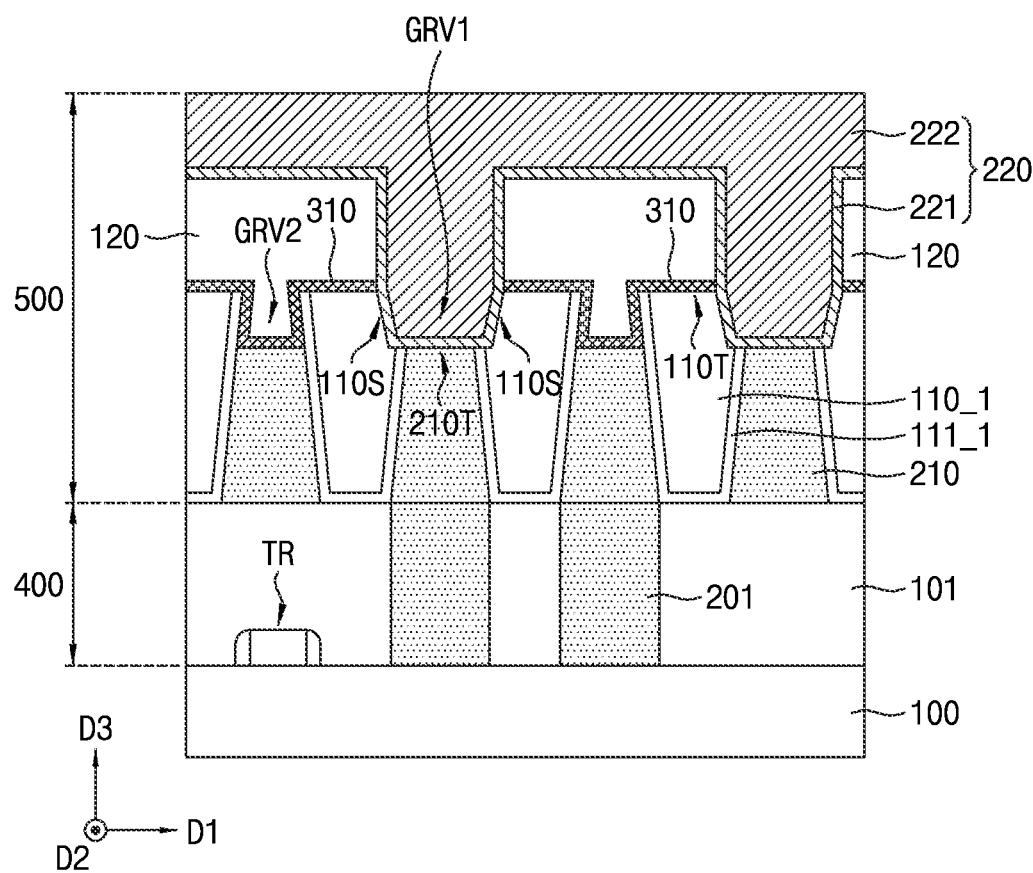
FIG. 19 illustrates a cross-sectional view of a semiconductor integrated circuit device according to embodiments of the inventive concepts.

FIG. 19 illustrates a cross-sectional view of a semiconductor integrated circuit device according to embodiments of the inventive concepts.

Referring to FIG. 19, a semiconductor integrated circuit device 10-4 according to this embodiment differs from the semiconductor integrated circuit device 10 according to the embodiment of FIG. 1 in that a second wiring layer 220 includes a portion contacting a side surface of a first insulating film 110_1.

In an embodiment a portion of an insulating liner 111_1 and a portion of the first insulating film 110_1 which contact a side surface of the second wiring layer 220 may be removed in a manufacturing procedure for the semiconductor integrated circuit device 10. For example, additionally referring to operations S160 and S170 of FIGS. 8 and 9, portions of the insulating liner 111_1 and the first insulating film 110_1 which would be adjacent to the hard mask pattern 320 may be removed simultaneously with removal of the hard mask pattern 320. Accordingly, the second wiring layer 220 in FIG. 19 may contact a portion of a side surface of the first insulating film 110-1 disposed at a higher level than a top surface 210T of a first wiring layer 210. In accordance with an embodiment, the first insulating film 110_1 may include an inclined surface 110S adjacent to an upper portion of the first wiring layer 210, and the second wiring layer 220 may contact the inclined surface 110S.

Figure 20:
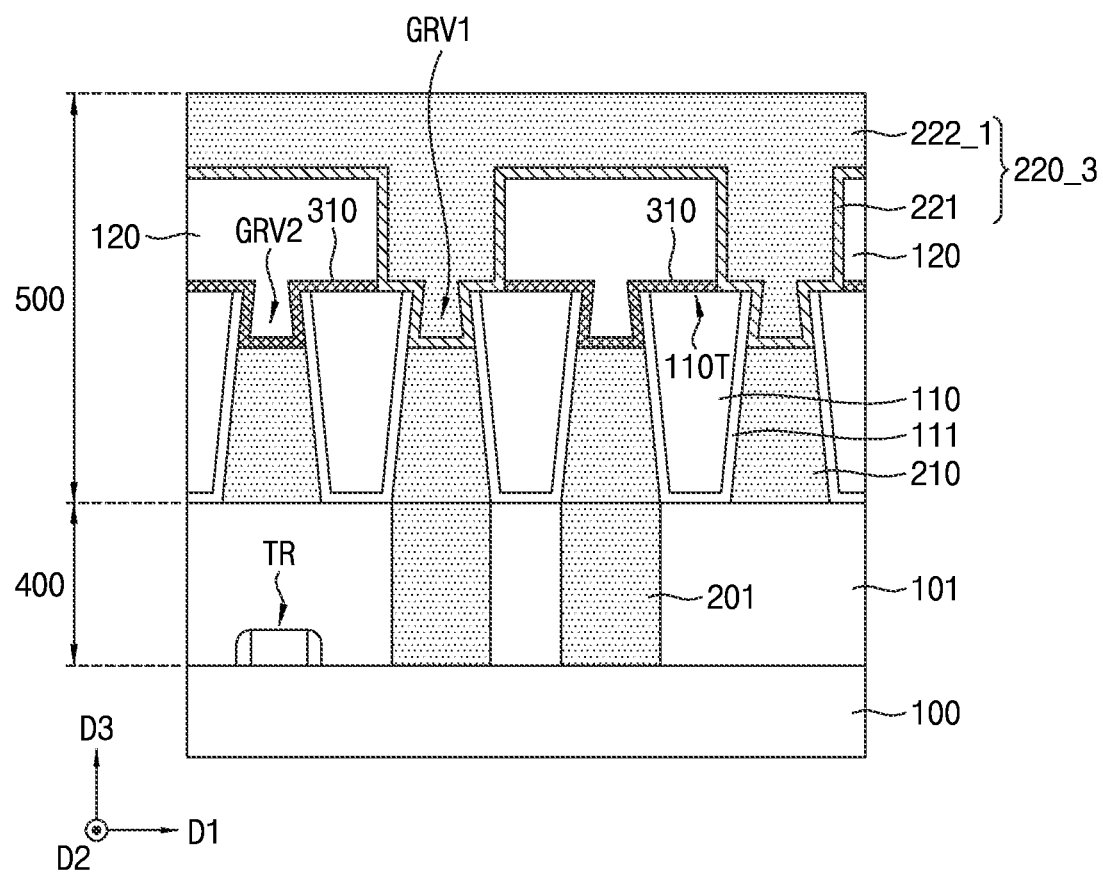
FIG. 20 illustrates a cross-sectional view of a semiconductor integrated circuit device according to embodiments of the inventive concepts.

FIG. 20 illustrates a cross-sectional view of a semiconductor integrated circuit device according to embodiments of the inventive concepts.

Referring to FIG. 20, a semiconductor integrated circuit device 10-5 according to this embodiment differs from the semiconductor integrated circuit device 10 according to the embodiment of FIG. 1 in that a metal film 222_1 of a second wiring layer 220_3 includes the same material as a first wiring layer 210.

In an embodiment, the first wiring layer 210 and the metal film 222_1 of the second wiring layer 220_3 may include, as the same material thereof, aluminum (Al), ruthenium (Ru), molybdenum (Mo), tungsten (W), cobalt (Co), or an alloy thereof.

Figure 21:
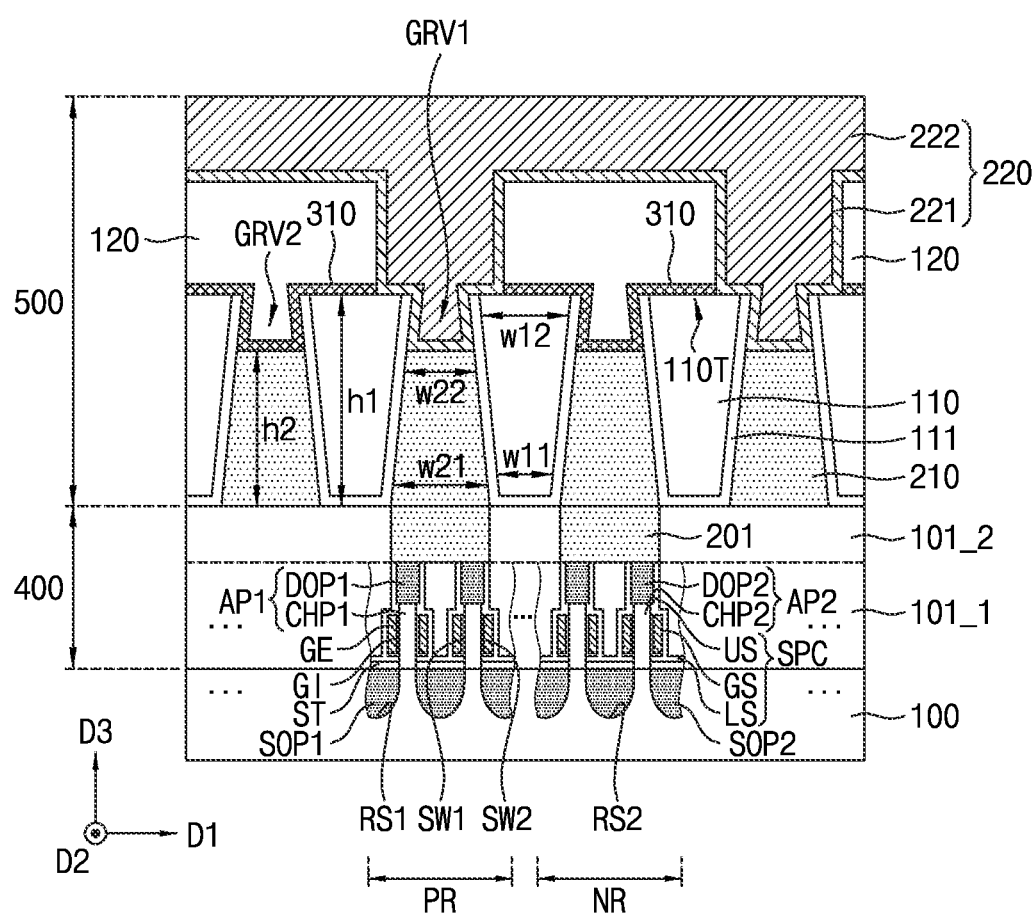
FIG. 21 illustrates a cross-sectional view of a semiconductor integrated circuit device according to embodiments of the inventive concepts.

FIG. 21 illustrates a cross-sectional view of a semiconductor integrated circuit device according to embodiments of the inventive concepts.

Referring to FIG. 21, an FEOL structure of a semiconductor integrated circuit device 10-6 according to this embodiment may include vertical transistors (vertical FETs) constituting a logic device, and wirings interconnecting the vertical transistors.

A logic cell LC on a substrate 100 may include a first active region PR and a second active region NR. For example, the first active region PR may be a PMOSFET region, and the second active region NR may be an NMOSFET region. The first and second active regions PR and NR may be spaced apart from each other in a first direction D1.

A first lower epitaxial pattern SOP1 may be provided on the first active region PR, and a second lower epitaxial pattern SOP2 may be provided on the second active region NR. When viewed in a plan view, the first lower epitaxial pattern SOP1 may overlap with the first active region PR, and the second lower epitaxial pattern SOP2 may overlap with the second active region NR. The first and second lower epitaxial patterns SOP1 and SOP2 may be epitaxial patterns formed through a selective epitaxial growth process. The first lower epitaxial pattern SOP1 may be provided in a first recess region RS1 of a substrate 100, and the second lower epitaxial pattern SOP2 may be provided in a second recess region RS2 of the substrate 100.

First active patterns AP1 may be provided on the first active region PR, and second active patterns AP2 may be provided on the second active region NR. Each of the first and second active patterns AP1 and AP2 may have a vertically-protruding fin shape. When viewed in a plan view, each of the first and second active patterns AP1 and AP2 may have a bar shape extending in the first direction D1. The first active patterns AP1 may be arranged in a second direction D2, and the second active patterns AP2 may be arranged in the second direction D2.

Each of the first active patterns AP1 may include a first channel pattern CHP1 vertically protruding from the first lower epitaxial pattern SOP1, and a first upper epitaxial pattern DOP1 on the first channel pattern CHP1. Each of the second active patterns AP2 may include a second channel pattern CHP2 vertically protruding from the second lower epitaxial pattern SOP2, and a second upper epitaxial pattern DOP2 on the second channel pattern CHP2.

An element isolation film ST may be provided on the substrate 100. The element isolation film ST may cover top surfaces of the first and second lower epitaxial patterns SOP1 and SOP2. The first and second active patterns AP1 and AP2 may protrude upwards over the element isolation film ST in a vertical direction.

Although not clearly shown, a plurality of gate electrodes GE extending in parallel in the second direction D2 may be provided on the element isolation film ST. The gate electrode GE may surround the first channel pattern CHP1 of the first active pattern AP1, and may surround the second channel pattern CHP2 of the second active pattern AP2. For example, the first channel pattern CHP1 of the first active pattern AP1 may have first and second side walls SW1 and SW2. The gate electrode GE may be provided on the first and second side walls SW1 and SW2. In other words, the gate electrode GE may surround the first and second side walls SW1 and SW2.

A gate dielectric pattern GI may be interposed between the gate electrode GE and each of the first and second channel patterns CHP1 and CHP2. The gate dielectric pattern GI may cover a bottom surface of the gate electrode GE and an inner side wall of the gate electrode GE. For example, the gate dielectric pattern GI may directly cover the first and second side walls SW1 and SW2 of the first active pattern AP1.

The first and second upper epitaxial patterns DOP1 and DOP2 may protrude upwards over the gate electrode GE in a vertical direction. A top surface of the gate electrode GE may be lower than each bottom surface of the first and second epitaxial patterns DOP1 and DOP2. In other words, each of the first and second active patterns AP1 and AP2 may have a structure extending through the gate electrode GE while vertically protruding from the substrate 100.

The semiconductor integrated circuit device 10-6 according to this embodiment may include vertical transistors in which carriers move in a third direction D3. For example, when the transistor is in a "gate-on" state in accordance with application of a voltage to a gate electrode GE thereof, carriers may move from the lower epitaxial patterns SOP1 and SOP2 to the upper epitaxial patterns DOP1 and DOP2 via the channel patterns CHP1 and CHP2. The gate electrodes GE according to this embodiment may completely surround side walls SW1 and SW2 of the channel patterns CHP1, and also the side walls of the channel patterns CHP2. In accordance with embodiments of the inventive concepts, the transistor may be a three-dimensional field effect transistor having a gate all around structure (for example, VFET). Since the gate surrounds the channel, the semiconductor device according to the exemplary embodiment of the disclosure may have excellent electrical characteristics.

A spacer SPC covering the gate electrodes GE and the first and second active patterns AP1 and AP2 may be provided on the element isolation film ST. The spacer SPC may include a silicon nitride film or a silicon oxynitride film. The spacer SPC may include a lower spacer LS, an upper spacer US, and a gate spacer GS between the lower and upper spacers LS and US.

The lower spacer LS may directly cover a top surface of the element isolation film ST. The gate electrodes GE may be spaced apart from the element isolation film ST in the third direction D3 by the lower spacer LS. The gate spacer GS may cover a top surface and an outer side wall of each of the gate electrodes GE. The upper spacer US may cover the first and second upper epitaxial patterns DOP1 and DOP2. Of course, the upper spacer US may expose top surfaces of the first and second upper epitaxial patterns DOP1 and DOP2 without covering the top surfaces.

A first interlayer insulating film 101_1 may be provided on the spacer SPC. A top surface of the first interlayer insulating film 101_1 may be substantially coplanar with the top surfaces of the first and second upper epitaxial patterns DOP1 and DOP2. A second interlayer insulating film 101_2 may be stacked on the first interlayer insulating film 101_1. The second interlayer insulating film 101_2 may cover the top surfaces of the first and second epitaxial patterns DOP1 and DOP2. At least one contact plug 201 contacting the first and second upper epitaxial patterns DOP1 and DOP2 while extending through the second interlayer insulating film 101_2 may be provided.

Figure 22:
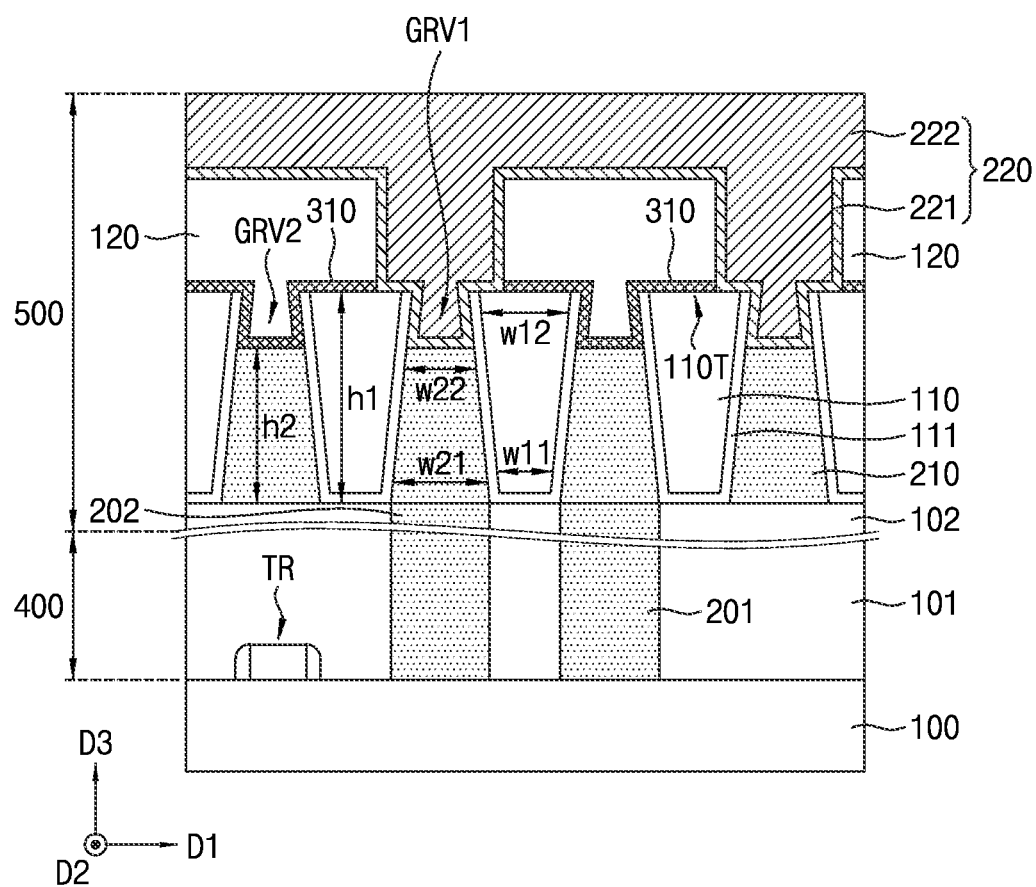
FIG. 22 illustrates a cross-sectional view of a semiconductor integrated circuit device according to embodiments of the inventive concepts.

FIG. 22 illustrates a cross-sectional view of a semiconductor integrated circuit device according to embodiments of the inventive concepts.

Referring to FIG. 22, relations among the first wiring layer 210, the second wiring layer 220, the first insulating film 110 and the second insulating film 120 in the semiconductor integrated circuit device 10 described in the embodiment of FIG. 1 may be applied to relations among an n-th wiring layer 210, an n+1-th wiring layer 220, an n-th insulating film 110 and an n+1-th insulating film 120 in a semiconductor integrated circuit device 10-7 according to this embodiment.

In an embodiment, a BEOL structure 500 may include an n−1-th insulating film 102 disposed at a relatively lower side, and an n−1-th wiring layer 202 extending through the n−1-th insulating film 102. Here, n is a natural number greater than 1.

The n-th insulating film 110 and the n+1-th insulating film 120 may be sequentially stacked on the n−1-th insulating film 102, and the n-th wiring layer 210 and the n+1-th wiring layer 220, which extend through the n-th insulating film 110 and the n+1-th insulating film 120, respectively, may be sequentially stacked. Description of the first wiring layer 210, the second wiring layer 220, the first insulating film 110 and the second insulating film 120 described in the embodiment of FIG. 1 may be applied to description of the n-th wiring layer 210, the n+1-th wiring layer 220, the n-th insulating film 110 and the n+1-th insulating film 120 in this embodiment.

Figure 23:
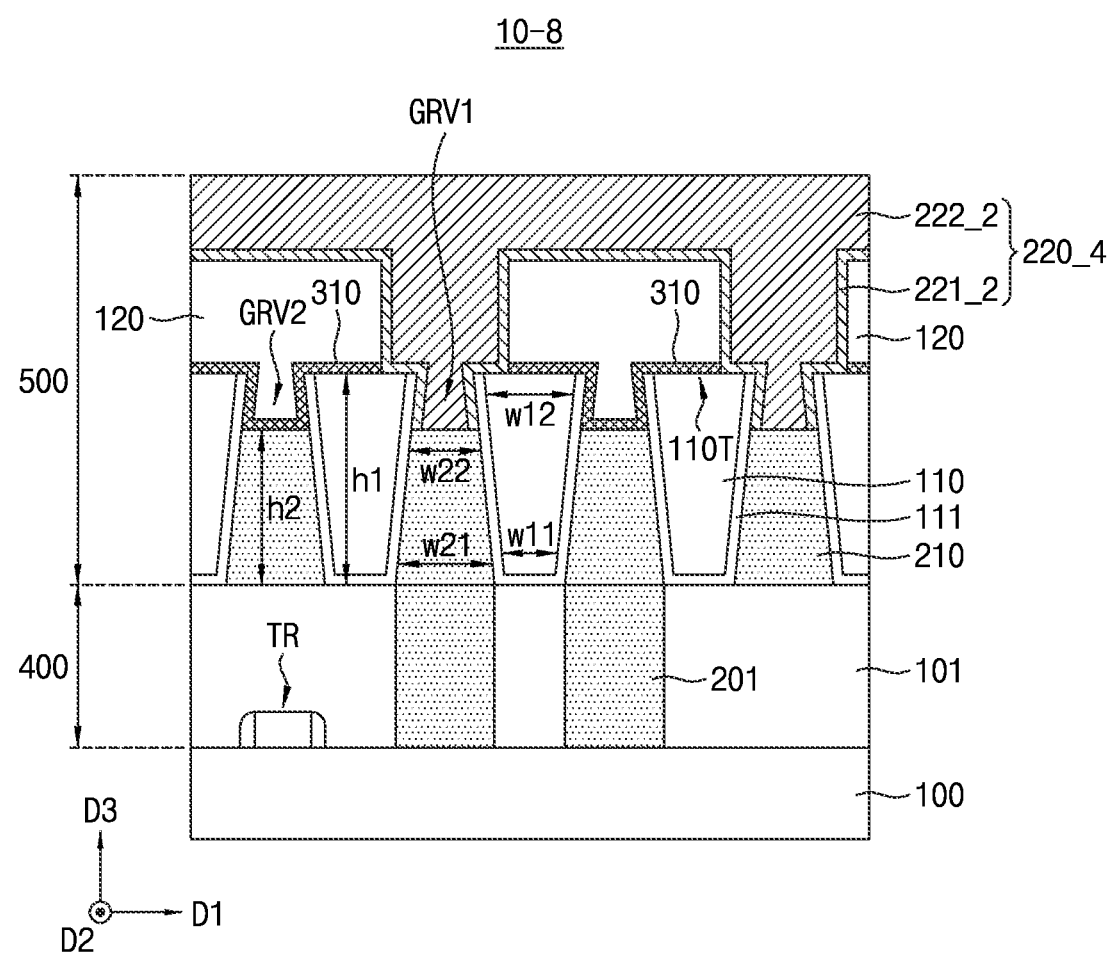
FIG. 23 illustrates a cross-sectional view of a semiconductor integrated circuit device according to embodiments of the inventive concepts.

FIG. 23 illustrates a cross-sectional view of a semiconductor integrated circuit device according to embodiments of the inventive concepts.

Referring to FIG. 23, a semiconductor integrated circuit device 10-8 according to this embodiment differs from the semiconductor integrated circuit device 10 according to the embodiment of FIG. 1 in that a first wiring layer 210 and a metal film 222_2 of a second wiring layer 220_4 directly contact each other.

In an embodiment, in a manufacturing process for the semiconductor integrated circuit device 10-8, a portion of a conductive barrier film 221_2 of the second wiring layer 220_4 overlapping with the first wiring layer 210 may be removed. Accordingly, the metal film 222_2 of the second wiring layer 220_4 may directly contact the first wiring layer 210.

In accordance with embodiments of the inventive concepts, self-alignment may be achieved through formation of a stepped structure without an additional layer formation procedure.

While embodiments of the inventive concepts have been described with reference to the accompanying drawings, it should be understood by those skilled in the art that various modifications may be made without departing from the scope of the inventive concepts and without changing essential features thereof. Therefore, the above-described embodiments should be considered in a descriptive sense only and not for purposes of limitation.

What is claimed is:

1. A semiconductor integrated circuit device comprising:
   a substrate;
   a transistor on the substrate;
   an interlayer insulating film on the transistor;

an insulating liner on the interlayer insulating film;
a first insulating film on the insulating liner; and
a first wiring layer on the interlayer insulating film and surrounded by the insulating liner,
wherein a height of a top surface of the first insulating film in a first direction from a main surface of the interlayer insulating film is greater than a height of a top surface of the first wiring layer in the first direction from the main surface of the interlayer insulating film, and a step exists between the top surfaces of the first wiring layer and the first insulating film,
wherein a height of the first insulating film is greater than a height of the first wiring layer, and
wherein a width of the first wiring layer gradually narrows as the first wiring layer extends along the first direction.

2. The semiconductor integrated circuit device according to claim 1, wherein a width of the top surface of the first wiring layer is 7 to 9 nm, and a width of a bottom surface of the first wiring layer is 9 to 11 nm.

3. The semiconductor integrated circuit device according to claim 1, wherein a height of the step in the first direction is 2 to 8 nm.

4. The semiconductor integrated circuit device according to claim 1, wherein a width of the first insulating film gradually increases as the first insulating film extends along the first direction.

5. The semiconductor integrated circuit device according to claim 1, wherein a carbon content of the first insulating film varies in accordance with the height of the first insulating film along the first direction.

6. The semiconductor integrated circuit device according to claim 5, wherein the carbon content continuously increases as the first insulating film extends along the first direction.

7. The semiconductor integrated circuit device according to claim 5, wherein the first insulating film comprises an SiOC film or an SiCOH film.

8. The semiconductor integrated circuit device according to claim 5, wherein the first insulating film includes a plurality of insulating parts, and the first wiring layer includes a plurality of wiring parts respectively sandwiched between the plurality of insulating parts,
the semiconductor integrated circuit device further comprising:
a first groove and a second groove on respective different ones of the plurality of wiring parts of the first wiring layer;
a second insulating film on the first insulating film and the first wiring layer and that exposes the first groove and fills the second groove; and
a second wiring layer on the second insulating film and that fills the first groove.

9. The semiconductor integrated circuit device according to claim 8, wherein a carbon content of the second insulating film is uniform along a height thereof along the first direction.

10. The semiconductor integrated circuit device according to claim 8, wherein the second wiring layer comprises a metal film, and a conductive barrier film surrounding the metal film, and
the metal film comprises a material different from a material of the first wiring layer.

11. The semiconductor integrated circuit device according to claim 10, wherein the first wiring layer comprises aluminum (Al), ruthenium (Ru), molybdenum (Mo), or an alloy thereof, and
the metal film comprises copper (Cu).

12. The semiconductor integrated circuit device according to claim 10, further comprising a mask film between the first insulating film and the second insulating film, between the first wiring layer and the second insulating film, and between the insulating liner and the second insulating film.

13. The semiconductor integrated circuit device according to claim 12, wherein the mask film is on a portion of the top surface of the first insulating film, and the conductive barrier film is on another portion of the top surface of the first insulating film.

14. The semiconductor integrated circuit device according to claim 8, wherein the first wiring layer and the second wiring layer are formed by different respective processes.

15. A semiconductor integrated circuit device comprising:
a substrate;
a front-end-of-line (FEOL) structure on the substrate, the FEOL structure including a transistor; and
a back-end-of-line (BEOL) structure on the FEOL structure,
wherein the BEOL structure comprises
a first insulating film including a carbon content that varies in accordance with a height of the first insulating film in a first direction from a main surface of the FEOL structure, and
a first wiring layer extending through the first insulating film,
wherein a height of a top surface of the first insulating film in the first direction from the main surface of the FEOL structure is different than a height of a top surface of the first wiring layer in the first direction from the main surface of the FEOL structure, and a step exists between the top surfaces of the first wiring layer and the first insulating film, and
wherein a width of the first wiring layer gradually narrows as the first wiring layer extends along the first direction.

16. The semiconductor integrated circuit device according to claim 15, wherein a width of the first insulating film gradually increases as the first insulating film extends along the first direction.

17. The semiconductor integrated circuit device according to claim 15, wherein the height of the top surface of the first insulating film is greater than the height of the top surface of the first wiring layer.

18. The semiconductor integrated circuit device according to claim 15, wherein the first insulating film includes a plurality of insulating parts, and the first wiring layer includes a plurality of wiring parts respectively sandwiched between the plurality of insulating parts,
the semiconductor integrated circuit device further comprising:
a first groove and a second groove on respective different ones of the plurality of wiring parts of the first wiring layer;
a second insulating film on the first insulating film and the first wiring layer and that exposes the first groove and fills the second groove; and
a second wiring layer on the second insulating film that fills the first groove, the second wiring layer comprising a metal film and a conductive barrier film surrounding the metal film,
wherein the metal film comprises a material different from a material of the first wiring layer, and
wherein the first wiring layer and the second wiring layer are formed by respective different processes.

19. The semiconductor integrated circuit device according to claim 18, wherein the second wiring layer contacts the first wiring layer through the first groove.

20. A semiconductor integrated circuit device comprising:

a substrate comprising a semiconductor material;

a front-end-of-line (FEOL) structure on the substrate, the FEOL structure including a transistor; and a back-end-of-line (BEOL) structured on the FEOL structure, wherein the BEOL structure comprises a first insulating film including a carbon content that varies in accordance with a height of the first insulating film in a first direction from a main surface of the FEOL structure, a first wiring layer extending through the first insulating film, wherein a height of a top surface of the first insulating film in the first direction from the main surface of the FEOL structure is different than a height of a top surface of the first wiring layer in the first direction from the main surface of the FEOL structure, and a step exists between the top surfaces of the first wiring layer and the first insulating film, an insulating liner surrounding a bottom portion and a side portion of the first insulating film, the insulating liner between the first insulating film and the first wiring layer, a second insulating film on the first insulating film and the first wiring layer and that exposes the first wiring layer, and a second wiring layer on the second insulating film and connected to the first wiring layer, the second wiring layer including a metal film comprising a material different from a material of the first wiring layer, and a conductive barrier film surrounding the metal film, wherein a width of the first wiring layer gradually narrows as the first wiring layer extends along the first direction, wherein a carbon content of the first insulating film continuously increases in accordance with a height thereof along the first direction, and wherein a carbon content of the second insulating film is uniform along a height thereof in the first direction.

* * * * *